US012363882B2

(12) United States Patent
Cao et al.

(10) Patent No.: US 12,363,882 B2
(45) Date of Patent: Jul. 15, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Xinman Cao, Hefei (CN); Zhongming Liu, Hefei (CN); Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 662 days.

(21) Appl. No.: 17/500,276

(22) Filed: Oct. 13, 2021

(65) Prior Publication Data
US 2022/0139923 A1    May 5, 2022

Related U.S. Application Data

(63) Continuation of application No. PCT/CN2021/097381, filed on May 31, 2021.

(30) Foreign Application Priority Data

Nov. 4, 2020  (CN) .......................... 202011217685.7

(51) Int. Cl.
*H10B 12/00* (2023.01)
*H01L 21/02* (2006.01)
*H01L 21/3105* (2006.01)
*H01L 21/3213* (2006.01)
*H01L 21/762* (2006.01)
*H01L 21/768* (2006.01)

(52) U.S. Cl.
CPC ....... *H10B 12/05* (2023.02); *H01L 21/02071* (2013.01); *H01L 21/31055* (2013.01);
(Continued)

(58) Field of Classification Search
CPC ......... H01L 21/32139; H01L 21/76811; H01L 21/76895; H01L 21/31055;
(Continued)

(56) References Cited

U.S. PATENT DOCUMENTS 5,700,740 A * 12/1997 Chen ................. H01L 21/02071
438/720
6,140,243 A * 10/2000 Wallace ............ H01L 21/02063
438/720
(Continued)

FOREIGN PATENT DOCUMENTS

CN  104835748 A   8/2015
CN  108831859 A   11/2018
(Continued)

OTHER PUBLICATIONS

International Search Report cited in PCT/CN2021/097381 mailed Sep. 3, 2021, 8 pages.

*Primary Examiner* — Michael M Trinh
(74) *Attorney, Agent, or Firm* — Kilpatrick Townsend & Stockton LLP

(57) ABSTRACT

The present application relates to the technical field of manufacturing semiconductor, and in particular to a method of manufacturing semiconductor structure and a semiconductor structure. The method of manufacturing semiconductor structure includes: forming a conductive layer on a substrate, and removing part of the conductive layer to form a contact structure composed of a plurality of contact pads; where each of the contact pads is electrically connected to a transistor structure on the substrate; and, after the contact pads are formed, removing residual core on top ends of the contact pads away from the substrate by dry etching.

7 Claims, 17 Drawing Sheets

(52) U.S. Cl.
CPC .. *H01L 21/32138* (2013.01); *H01L 21/32139* (2013.01); *H01L 21/76224* (2013.01); *H01L 21/76895* (2013.01); *H10B 12/485* (2023.02); *H01L 21/76811* (2013.01)

(58) Field of Classification Search
CPC ......... H01L 21/76224; H01L 21/32138; H01L 21/02071; H10B 12/05; H10B 12/485
See application file for complete search history.

(56) References Cited

U.S. PATENT DOCUMENTS

| | | | | |
|---|---|---|---|---|
| 6,531,747 | B1* | 3/2003 | Ashida | H10B 10/12 |
| | | | | 257/E27.099 |
| 6,554,004 | B1* | 4/2003 | Nguyen | H01L 21/02063 |
| | | | | 216/64 |
| 7,250,361 | B2* | 7/2007 | Lee | H01L 24/05 |
| | | | | 257/E21.228 |
| 10,854,614 | B2 | 12/2020 | Kim et al. | |
| 2002/0094657 | A1* | 7/2002 | Yang | H01L 28/60 |
| | | | | 257/E21.011 |
| 2008/0203456 | A1* | 8/2008 | Kim | H01L 27/0207 |
| | | | | 257/306 |
| 2017/0125283 | A1* | 5/2017 | Lee | H10B 12/34 |
| 2020/0105519 | A1* | 4/2020 | Lin | H01L 21/285 |

FOREIGN PATENT DOCUMENTS

| | | |
|---|---|---|
| CN | 110010604 A | 7/2019 |
| TW | 451345 B | 8/2001 |

* cited by examiner

METHOD OF MANUFACTURING SEMICONDUCTOR STRUCTURE AND SEMICONDUCTOR STRUCTURE

CROSS-REFERENCE TO RELATED APPLICATION

This is a continuation of International Patent Application No. PCT/CN2021/097381, filed on May 31, 2021, which claims the priority to Chinese Patent Application No. 202011217685.7, titled "METHOD OF MANUFACTURING SEMICONDUCTOR STRUCTURE AND SEMICONDUCTOR STRUCTURE", filed to China National Intellectual Property Administration on Nov. 4, 2020. The entire contents of International Patent Application No. PCT/CN2021/097381 and Chinese Patent Application No. 202011217685.7 are incorporated herein by reference.

TECHNICAL FIELD

The present application relates to the technical field of manufacturing semiconductor, and in particular to a method of manufacturing semiconductor structure and a semiconductor structure.

BACKGROUND

With the gradual development of storage device technology, Dynamic Random Access Memory (DRAM) is gradually applied in various electronic devices with its higher density and faster reading and writing speed. The dynamic random access memory is composed of multiple repeated storage units. The storage unit usually includes a capacitor structure and a transistor structure, and the transistor structure is connected to the capacitor structure to read data stored in the capacitor structure through the transistor structure or write data into the capacitor structure.

In the related art, the transistor structure is arranged in a substrate, and a contact structure is arranged on the substrate, and the contact structure is connected to a source of the transistor structure. During production, a conductive layer is first formed on the substrate, and then the conductive layer is etched to form a contact structure composed of multiple contact pads; then the contact structure is sequentially wet etched multiple times to remove the carbon-based polymer and the residual core on the landing pad.

However, when the residue on the contact pad is removed by multiple wet etchings, part of the film between the contact pad and the substrate will be removed, so that the connection area between the contact pad and the substrate is reduced, which is prone to cause the contact pad fracture.

SUMMARY

Some embodiments of the present application provide a method of manufacturing semiconductor structure and a semiconductor structure.

An embodiment of the present application provides a method of manufacturing semiconductor structure, which includes: providing a substrate, the substrate being with a plurality of transistor structures arranged at intervals; forming a conductive layer on the substrate, and removing part of the conductive layer to form a contact structure composed of a plurality of contact pads; wherein each of the contact pads is electrically connected to a transistor structure; and removing residual core on top ends of the contact pads away from the substrate by dry etching.

An embodiment of the present application also provides a semiconductor structure, including a substrate and a contact structure arranged on the substrate; where the substrate is provided with a plurality of transistor structures arranged at intervals, and the contact structure includes a plurality of contact pads, each of the contact pads is connected to a transistor structure; after forming the contact pads, residual core on top ends of the contact pads away from the substrate is removed by dry etching.

BRIEF DESCRIPTION OF THE DRAWINGS

In order to explain the embodiments of the present application or the technical solutions in the prior art more clearly, the following will briefly introduce the drawings that need to be used in the description of the embodiments or the prior art. Obviously, the drawings in the following description are some embodiments of the present application. For those of ordinary skill in the art, other drawings can be obtained based on these drawings without creative work.

DETAILED DESCRIPTION

Figure 1:
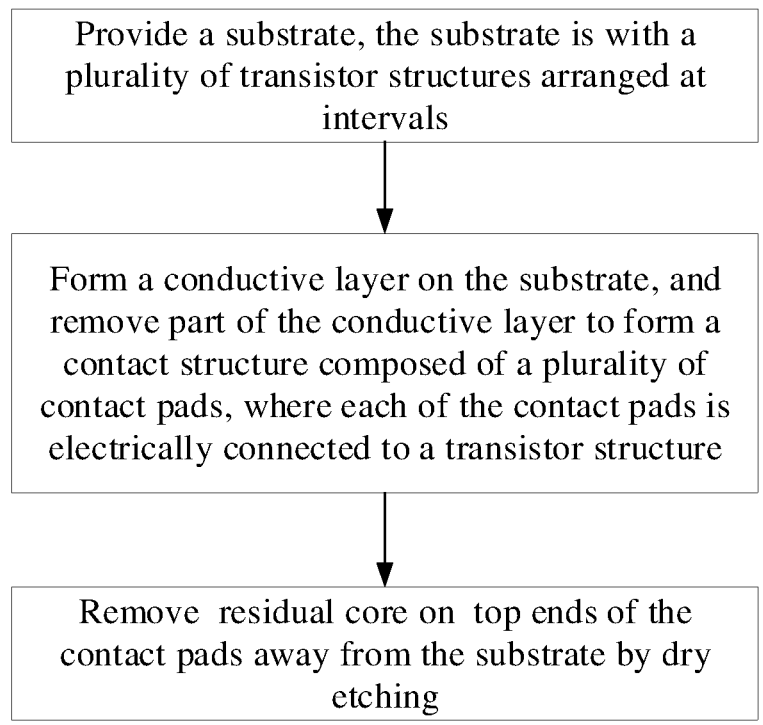
FIG. 1 is a flowchart of a method of manufacturing semiconductor structure according to an embodiment of the present application.

In order to make the objectives, technical solutions, and advantages of the embodiments of the present application clearer, the technical solutions in the embodiments of the present application will be described clearly and completely in conjunction with the accompanying drawings in the embodiments of the present application. Obviously, the described embodiments are part of the embodiments of the present application, rather than all of the embodiments. Based on the embodiments of the present application, all other embodiments obtained by those of ordinary skill in the art without creative work shall fall within the protection scope of the present application.

Dynamic random access memory (DRAM) includes multiple repeating memory cells. The memory cell includes a capacitor structure and a transistor structure. The gate of the transistor structure is connected to the word line, the drain of the transistor structure is connected to the bit line, and the source of the transistor structure is connected to the capacitor structure; the voltage signal on the word line can control turning on or turning off of the transistor, and then the data stored in the capacitor structure can be read through the bit line, or the data can be written into the capacitor structure through the bit line.

In the related art, a plurality of transistor structures are arranged in a substrate at intervals, and a contact structure is arranged on the substrate. The contact structure includes a plurality of contact pads at intervals, and each of the contact pad is connected to a source of a transistor structure. During the manufacturing, an insulation structure is firstly formed on the substrate. The insulation structure is provided with a plurality of contact holes, and each of the contact holes faces a source of a transistor structure; a conductive barrier layer is formed on the sidewalls of each of the contact holes, a bottom of each of the contact holes, and the insulation structure; and a conductive layer is formed on the conductive barrier layer, and the conductive layer fills the contact holes; the amorphous carbon mask layer is taken as a mask, to remove part of the conductive layer, part of the conductive barrier layer and part of the insulation structure, which correspond to the contact hole, to form a plurality of contact pads; each of the contact pads includes a first part located in the contact hole and a second part located on the insulation structure; the contact pads are etched by wet etching, to remove the carbon-based polymer remaining on the sidewalls of the contact pads and the top ends of the contact pads away from the substrate; the contact pads are wet etched again to remove the residual core at the top ends of the contact pads.

Specifically, taking the conductive layer as metal tungsten as an example, after the etching process to form the contact pads, an ashing process is required to remove the mask layer. At high temperature, after etching, the halogen-containing by-products reacts with tungsten to form tungsten halides, halogen-containing by-products are easier to volatilize, and soon the halogen content in the tungsten halide becomes less, and the tungsten is difficult to volatilize, forming a shell-like inclusion of tungsten, which is the residual core.

However, after the contact pads are formed, the residue on the contact pads is removed by multiple wet etchings. During the etching process, part of the conductive barrier layer (the conductive barrier layer between the second part and the insulation structure) between the contact pads and the surface of the insulation structure away from the substrate is removed. So that the connection area between the contact pads and the junction structure is reduced, and the contact pads are prone to fracture.

The embodiment provides a method of manufacturing semiconductor structure and a semiconductor structure, the residual core at the top ends of the contact pads is removed by dry etching; due to the dry etching is anisotropic, when the top ends of the contact pads are etched, the conductive barrier layer between the contact pads and the surface of the insulation structure away from the substrate can be prevented from being removed, the connection force between the contact pads and the insulation structure is ensured, and the contact pads are prevented from being fracture.

This embodiment does not limit the semiconductor structure. The following will introduce the semiconductor structure a dynamic random access memory (DRAM) as an example, but this embodiment is not limited to this. The semiconductor structure in this embodiment may also be other structures.

As shown in FIG. 1, the method of manufacturing semiconductor structure provided by this embodiment includes:

S101: provide a substrate, the substrate being with a plurality of transistor structures arranged at intervals in the substrate.

Figure 2:
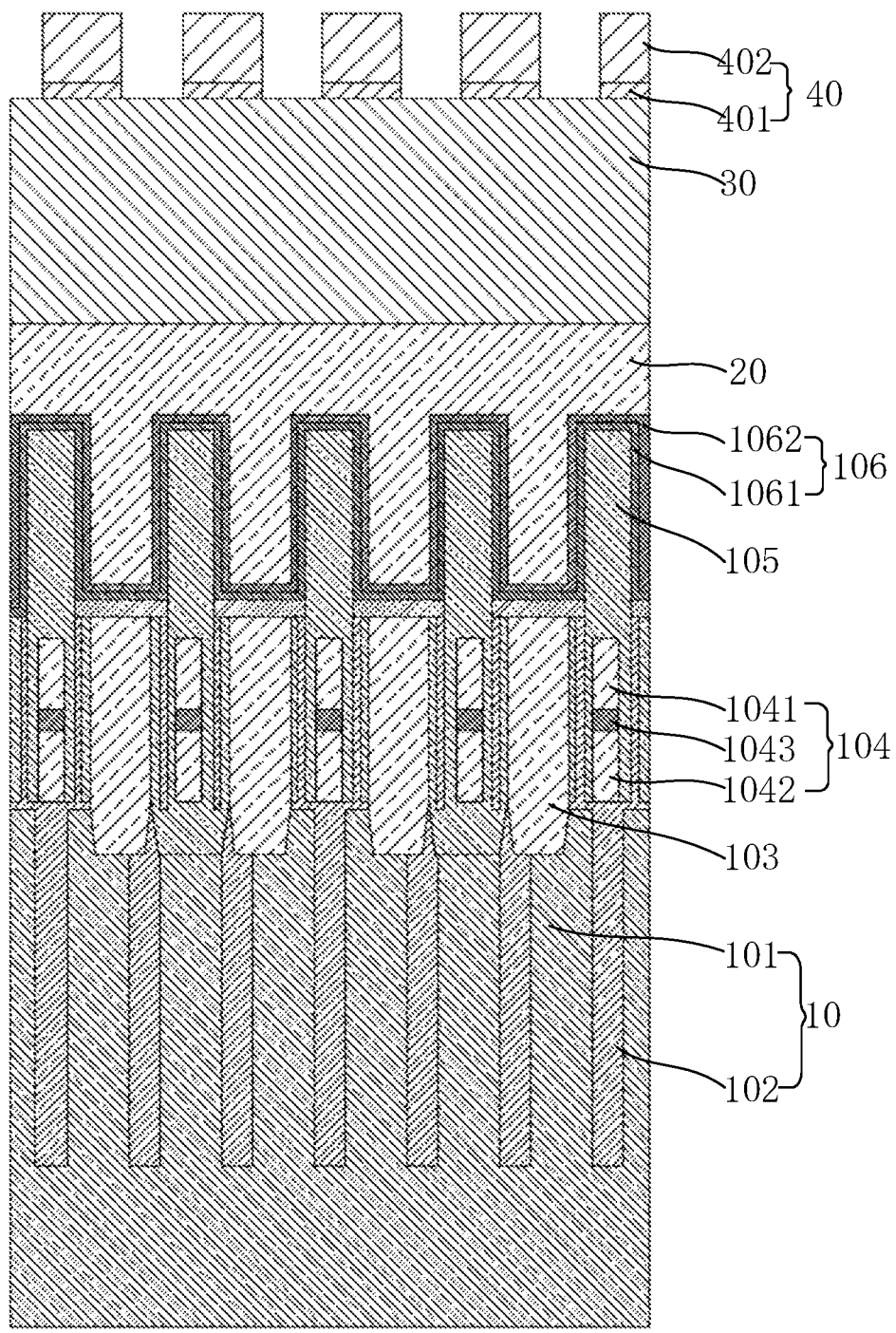
FIG. 2 is a schematic diagram of a structure after a photolithography layer is formed in a method of manufacturing semiconductor structure according to an embodiment of the present application.
Figure 3:
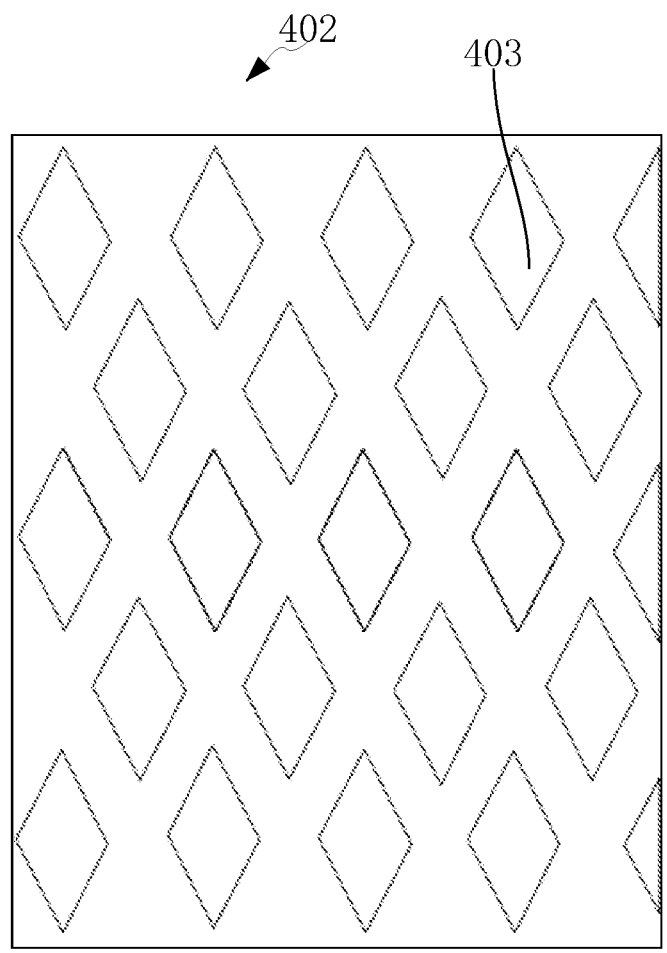
FIG. 3 is a top view of FIG. 2.

Referring to FIGS. 2 and 3, the substrate 10 may include a plurality of shallow trench isolation structures 102 arranged at intervals, and transistor structures are arranged between adjacent shallow trench isolation structures 102, and the transistor structures include an active area structure 101. The material of the shallow trench isolation structure 102 may include oxides such as silicon oxide, and the material of the active area structure 101 may include silicon, etc.

The substrate 10 further includes a plurality of conductive blocks 103 arranged at intervals, and each conductive block 103 is joined to an active area structure 101. In some embodiments, the material of the conductive block 103 may include conductive material such as polysilicon.

Further, a bit line 104 is arranged in between adjacent active area structures 101, and the bit line 104 may include a first bit line structure 1041, a bit line barrier layer 1043, and a second bit line structure 1042 that are stacked. The second bit line structure 1042 is arranged close to the active area structure 101 and the shallow trench isolation structure 102; the bit line barrier layer 1043 can prevent the material between the first bit line structure 1041 and the second bit line structure 1042 from interpenetrating each other, and the bit line barrier layer 1043 can also realize the electrical connection between the first bit line structure 1041 and the second bit line structure 1042. In some embodiments, the material of the first bit line structure 1041 may include tungsten, etc., the material of the second bit line structure 1042 may include polysilicon, etc., and the material of the bit line barrier layer 1043 may include titanium nitride, etc.

In the foregoing implementation manner, in order to achieve an insulating connection between the conductive block 103 and the bit line 104, an insulating film may be arranged between the conductive block 103 and the bit line 104. The material of the exemplary insulating film may include silicon nitride, silicon oxide, and so on.

Continuing to refer to FIG. 1, the method of manufacturing semiconductor structure provided by this embodiment further includes:

S102: a conductive layer is formed on the substrate, and a part of the conductive layer is removed to form a contact structure composed of a plurality of contact pads, and each contact pad is electrically connected to a transistor structure.

Referring to FIGS. 2 to 5, a plurality of conductive blocks 103 are arranged on the substrate 10, and each conductive block 103 is bonded to an active area structure 101, each contact pad 201 is connected to a conductive block 103 to achieve electrical connection between the contact pad 201 and the active area structure 101, and further realize the electrical connection between the contact pad 201 and the transistor structure.

In some embodiments, the material of the conductive layer 20 may include tungsten, etc. Correspondingly, the contact pad 201 is a metal pad made of tungsten, and the contact pad 201 is used to electrically connect with the capacitor structure to read data in the capacitor structure or write data into the capacitor structure.

In this embodiment, the contact pad 201 includes a top end away from the substrate 10, a bottom facing toward the substrate 10, and sidewalls each located between the top ends and the bottom. The top end of the contact pad 201 is configured to electrical connection with the capacitor structure, and the bottom of the contact pad 201 is configured to electrically connect to the transistor structure.

Continuing to refer to FIGS. 2 to 5, in some embodiments, before the conductive layer 20 is formed, further includes: an insulation structure 105 is formed on the substrate 10, the insulation structure 105 has a plurality of contact holes, and each of the contact holes faces a transistor structure; for example, the material of the insulation structure 105 may include silicon nitride, silicon oxide, and so on.

In the implementation in which the conductive block 103 joined to the active area structure 101 is arranged on the substrate 10, the insulation structure 105 is arranged on the conductive block 103 and the bit line 104, and each contact hole is arranged to face a conductive block 103.

After the insulation structure 105 is formed, a conductive layer 20 is formed in the contact holes and on the insulation structure 105, that is, the conductive layer 20 fills the contact holes and the conductive layer 20 covers a side of the insulation structure 105 away from the substrate 10. Through the above arrangement, the insulation structure 105 can realize isolation between adjacent contact pads 201, thereby avoiding contact between adjacent contact pads 201.

Continuing to refer to FIGS. 2 to 5, in this embodiment, after the insulation structure 105 is formed on the substrate 10, the method further includes:

A conductive barrier layer 106 is formed on the insulation structure 105, the sidewalls of the contact holes and the bottoms of the contact holes. Wherein, the conductive barrier layer 106 is not filling the contact holes. In the subsequent step, the conductive layer 20 is formed on the conductive barrier layer 106 and is bonded to the conductive barrier layer 106.

With this arrangement, the conductive barrier layer 106 can prevent penetration between the contact pad 201 and the conductive block 103, and the conductive barrier layer 106 can also achieve electrical connection between the contact pad 201 and the conductive block 103, thereby improving the performance of the semiconductor structure. In some embodiments, the conductive barrier layer 106 may include a first barrier layer 1061 and a second barrier layer 1062, the first barrier layer 1061 is arranged close to the substrate 10, and the second barrier layer 1062 is configured to bond with the contact pad 201. The material of the first barrier layer 1061 may include titanium, and the material of the second barrier layer 1062 may include titanium nitride. In this embodiment, the material of the conductive barrier layer 106 is not limited, as long as the penetration between the contact pad 201 and the conductive block 103 can be prevented, and the electrical connection between the contact pad 201 and the conductive block 103 can be achieved.

Further, before forming the conductive barrier layer 106, it also includes forming an intermediate layer on the side of the conductive block 103 away from the substrate 10, the material of the intermediate layer may include cobalt silicide (Co etc., that is, the contact pad 201 is electrically connected to the active area structure 101 by the conductive barrier layer 106, the intermediate layer, and the conductive block 103 in sequence.

Continuing to refer to FIGS. 1 to 5, in this embodiment, the conductive layer 20 is removed to form a contact structure composed of a plurality of contact pads 201 includes: a pattern transfer layer 30 is formed on the conductive layer 20, the pattern transfer layer has a plurality of discrete first patterns 301. Projections of the first patterns 301 on the insulation structure cover part of the contact holes, and a part of the insulation structure 105 and part of the conductive layer 20 are etched by taking the first patterns 301 as a mask to form a plurality of contact pads 201.

The first patterns 301 are taken as a mask to remove part of the conductive layer 20, and to form contact pads 201. With this arrangement, the formed contact pads 201 have a high dimensional accuracy, which improves the performance of the semiconductor structure. In some embodiments, part of the conductive layer 20 may be removed by etching to form the contact pads 201.

In the above implementation, in the process of removing part of the conductive layer 20, the conductive barrier layer 106 and the insulation structure 105 which correspond to the gap between the adjacent first patterns 301 are removed at the same time, so that the formed contact pads 201 include a first part located in the contact holes and a second part covering the insulation structure 105. Reasonable setting of the etching depth can avoid damaging the conductive barrier layer 106 at the bottom of the contact hole, and each film layer on the side of the conductive barrier layer 106 facing toward the substrate 10.

Continuing to refer to FIGS. 2 to 5, in some embodiments, a pattern transfer layer 30 is formed on the conductive layer 20 includes: a pattern transfer layer 30, a mask layer 40, and a patterned mask layer 40 are sequentially formed on the conductive layer 20 to form a plurality of discrete second patterns 403. The pattern transfer layer 30 is etched by taking the second patterns 403 as a mask to form a plurality of discrete first patterns 301.

With this arrangement, the pattern transfer of the mask layer 40 further forms the first patterns 301 on the pattern transfer layer 30, which improves the dimensional accuracy of the first pattern 301.

In some embodiments, the material of the pattern transfer layer 30 may include amorphous carbon, the material of the mask layer 40 may include silicon oxynitride, silicon oxide, etc. The mask layer 40 may be a single film layer, of course, the mask layer 40 may also be a multiple films layer. In some embodiments, in an implementation manner in which the mask layer 40 is a multiple layer films layer, the mask layer 40 includes a first mask layer 401 and a second mask layer 402 that are stacked, and the second mask layer 402 is located on the first mask layer 401. The mask layer 40 is patterned so that the second patterns 403 are formed on the mask layer 40, and the pattern transfer layer 30 is etched by taking the second patterns 403 as a mask, thereby forming the first patterns 301. The mask layer 40 is patterned to form a plurality of discrete second patterns 403. In this embodiment, a two-step SADP process can be used to cross form the second patterns 403. In other embodiments, the second patterns 403 can also be formed by other patterning methods.

Further, after the pattern transfer layer 30 is taken as a mask to remove part of the conductive layer 20 to form the contact pad 201, a part of the mask layer 40 will remain on the contact pad 201. Therefore, in the subsequent process, the remaining mask layer 40 needs to be removed, to expose the top of the contact pad 201 to facilitate electrical connection between the contact pad 201 and the capacitor structure.

Referring to FIGS. 6 to 9, in the foregoing implementation manner, after the contact pad 201 is formed, the method further includes: the residual polymer 202 on the contact pad 201 is removed by wet etching. With this arrangement, the residual polymer 202 on the top and side walls of the contact pad 201 can be removed, and the connection resistance between the contact pad 201 and the capacitor structure can be reduced, thereby improving the performance of the semiconductor structure.

Figure 4:
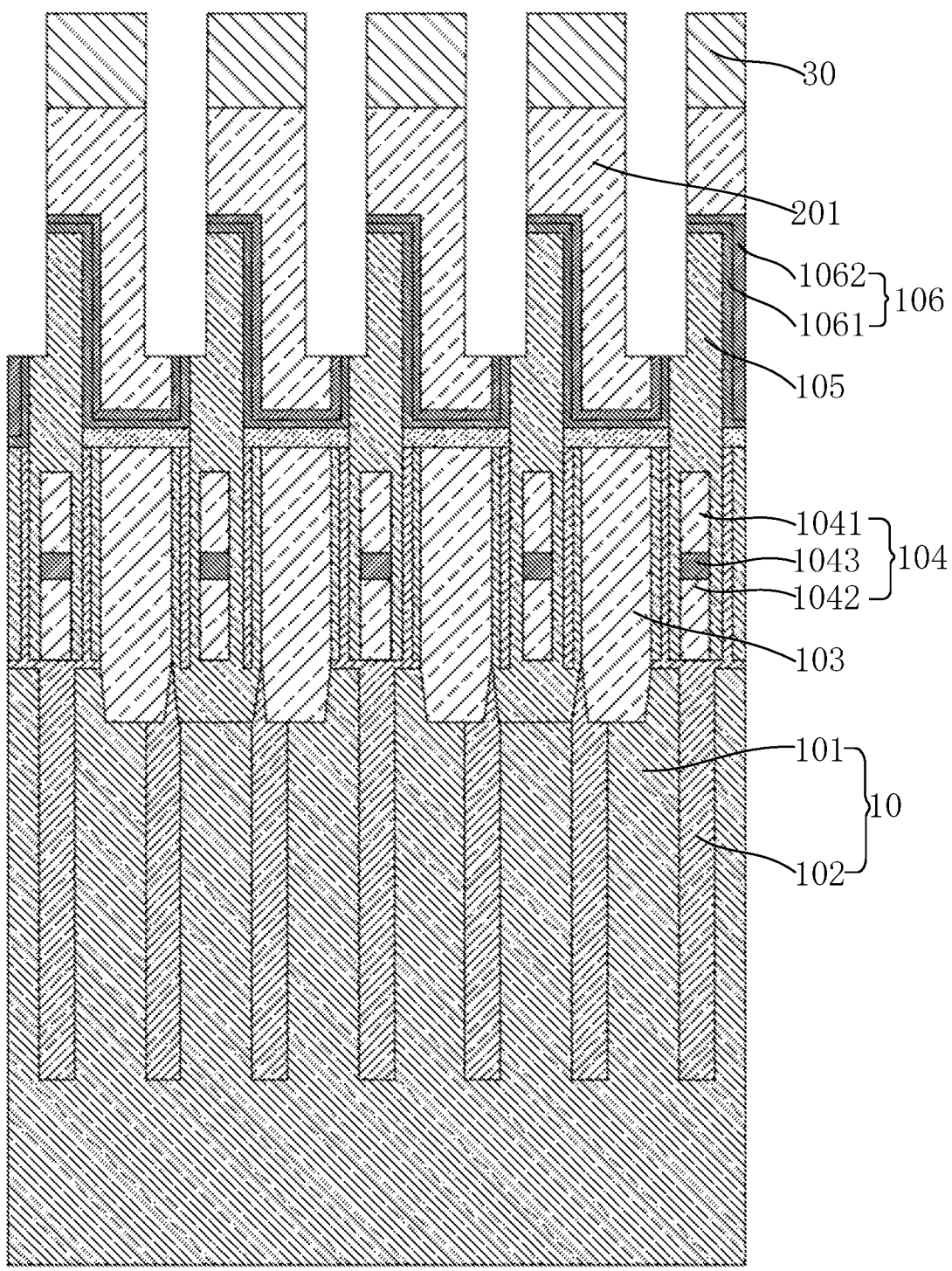
FIG. 4 is a schematic diagram of a structure after forming contact pads in a method of manufacturing semiconductor structure according to an embodiment of the present application.
Figure 5:
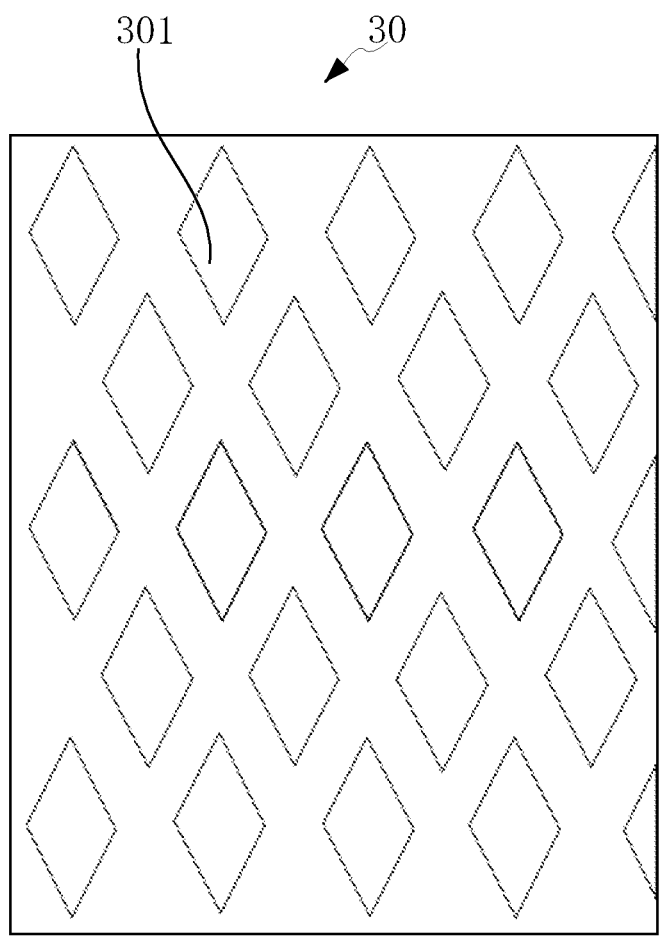
FIG. 5 is a top view of FIG. 4.
Figure 6:
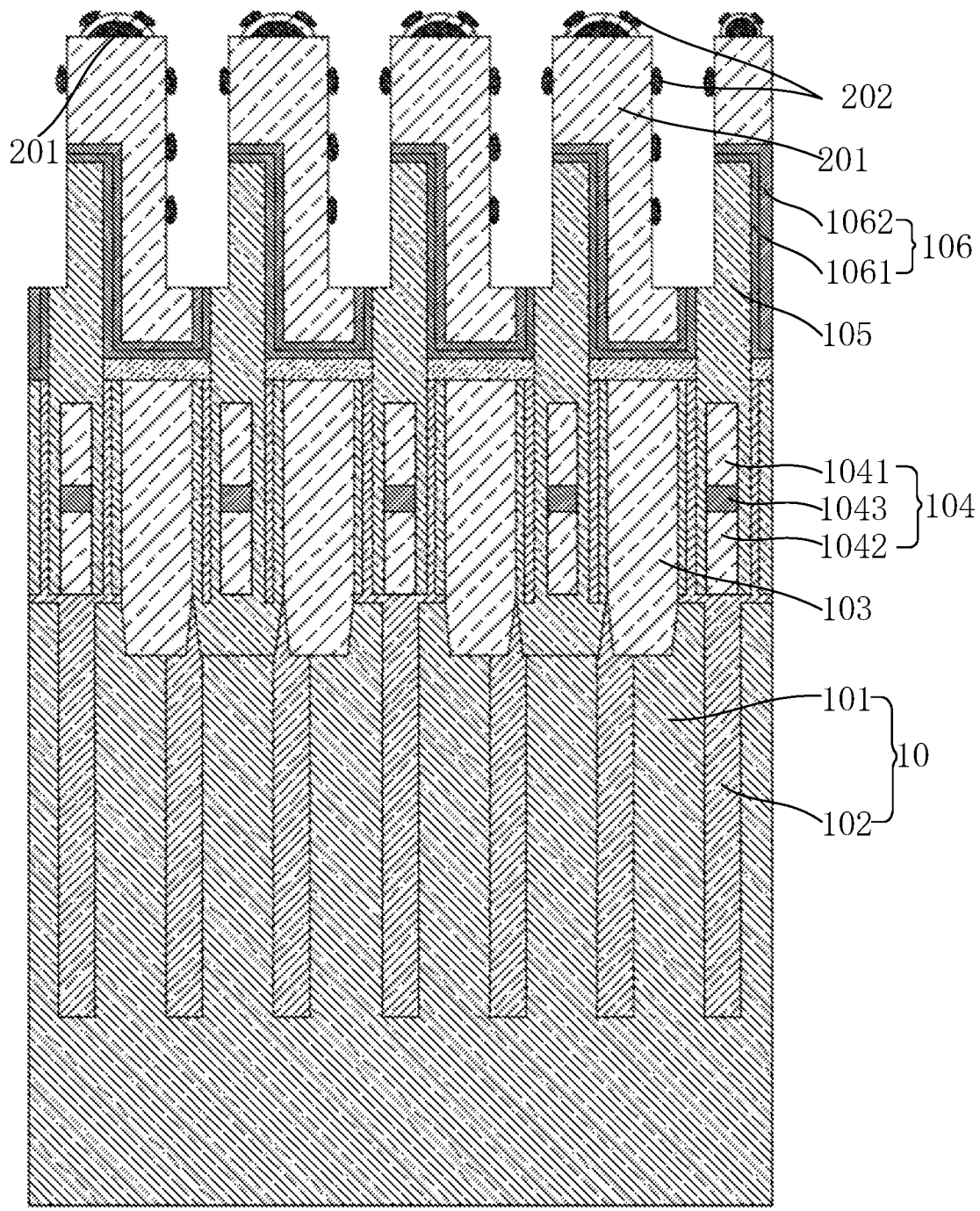
FIG. 6 is a schematic diagram of a structure with residual polymer and residual core on the contact pad in a method of manufacturing semiconductor structure according to an embodiment of the present application.
Figure 7:
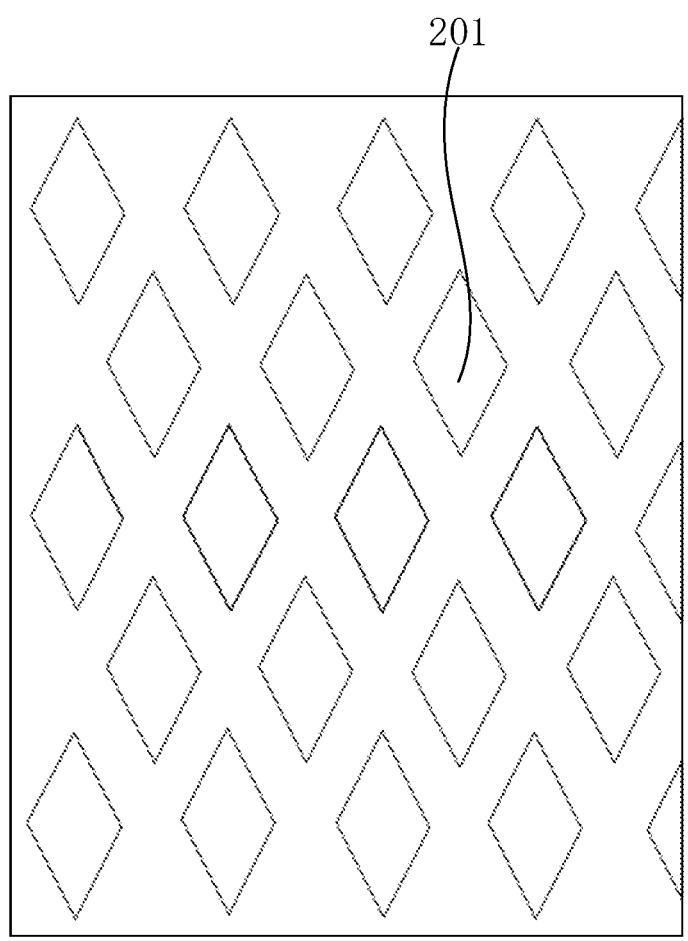
FIG. 7 is a top view of FIG. 6.
Figure 8:
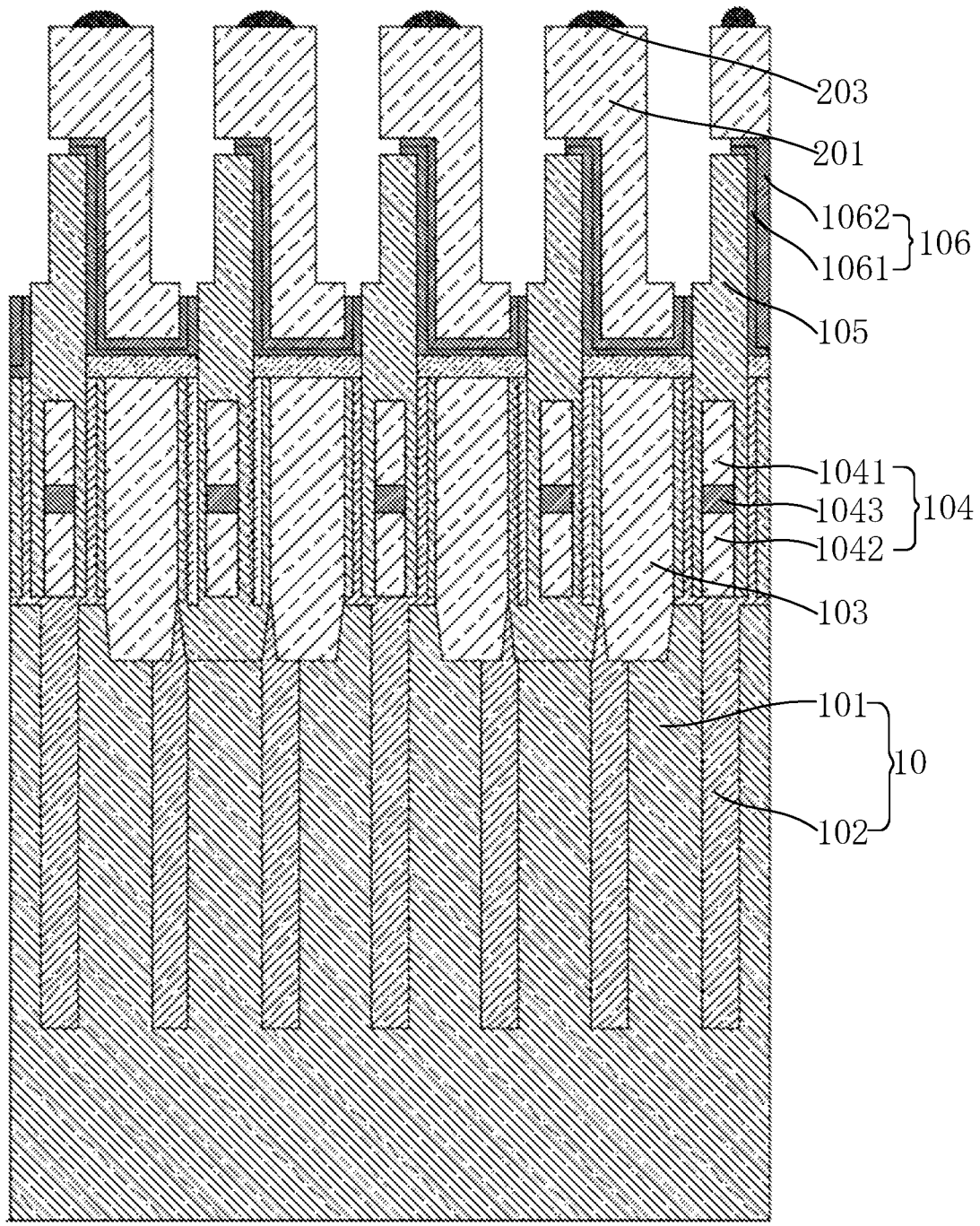
FIG. 8 is a schematic diagram of a structure after the residual polymer is removed by wet etching in a method of manufacturing semiconductor structure according to an embodiment of the present application.
Figure 9:
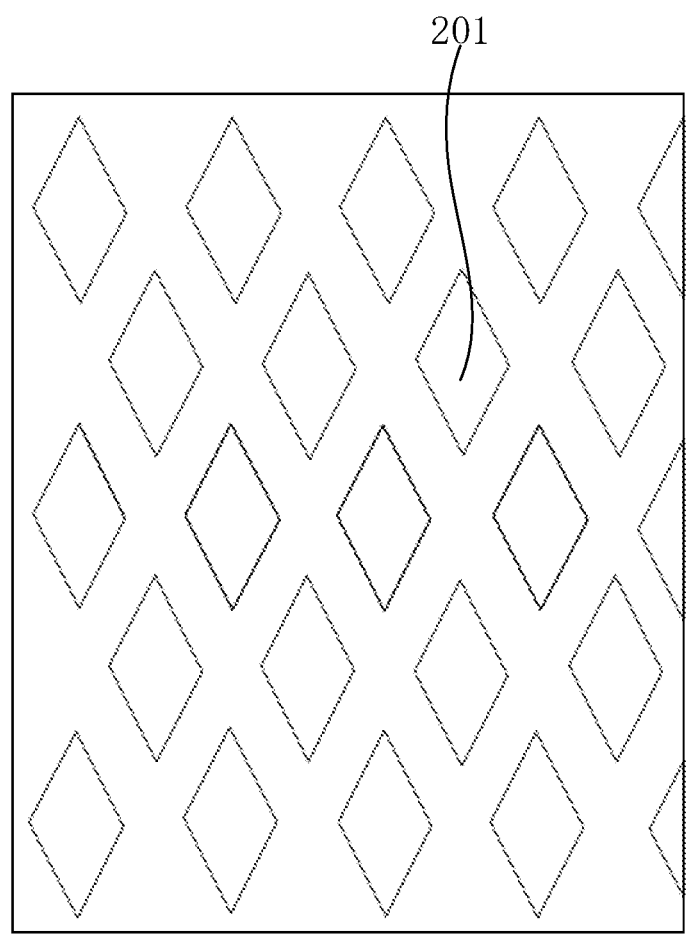
FIG. 9 is a top view of FIG. 8.
Figure 10:
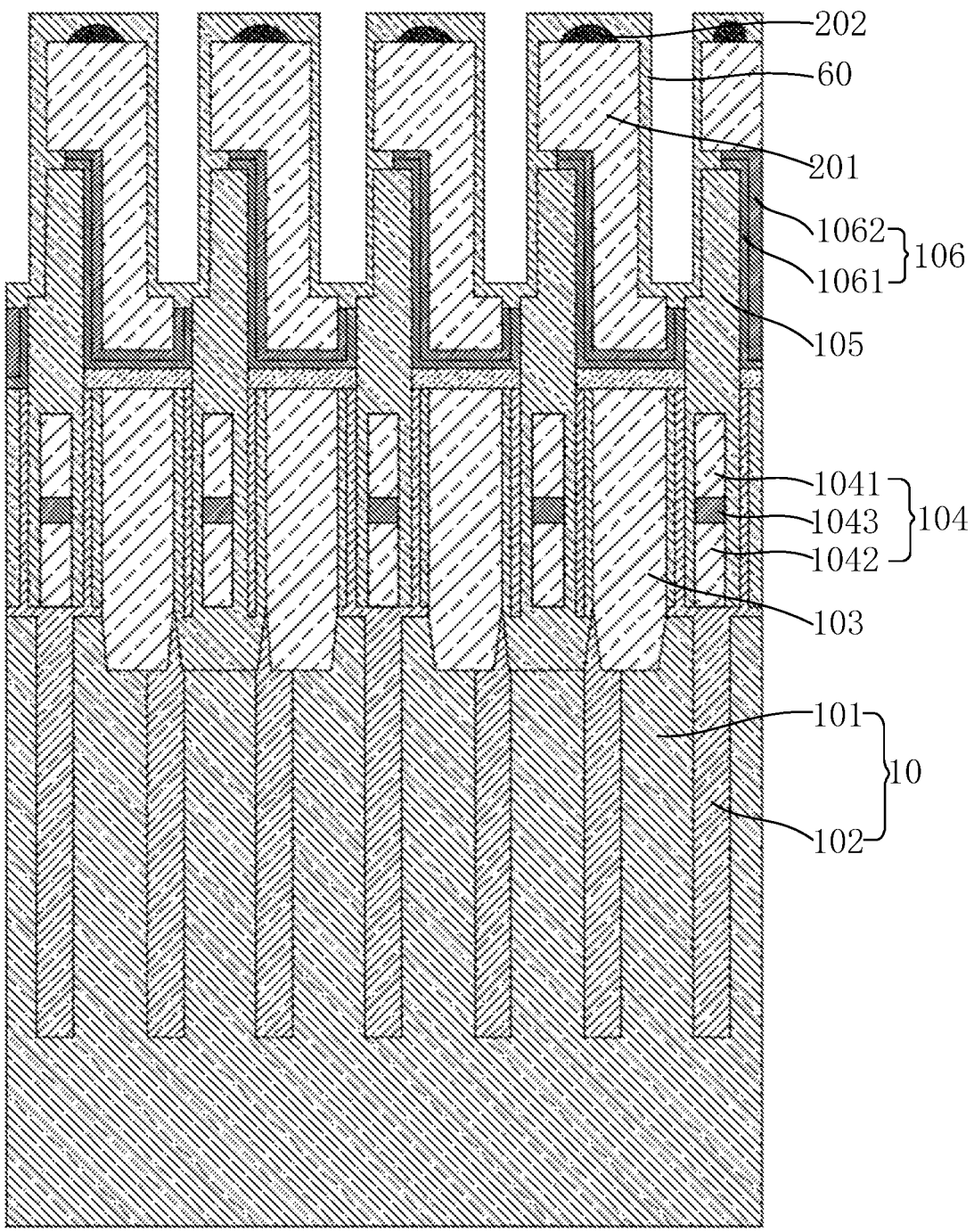
FIG. 10 is a schematic diagram of a structure after forming a protective layer in a method of manufacturing semiconductor structure according to an embodiment of the present application.
Figure 11:
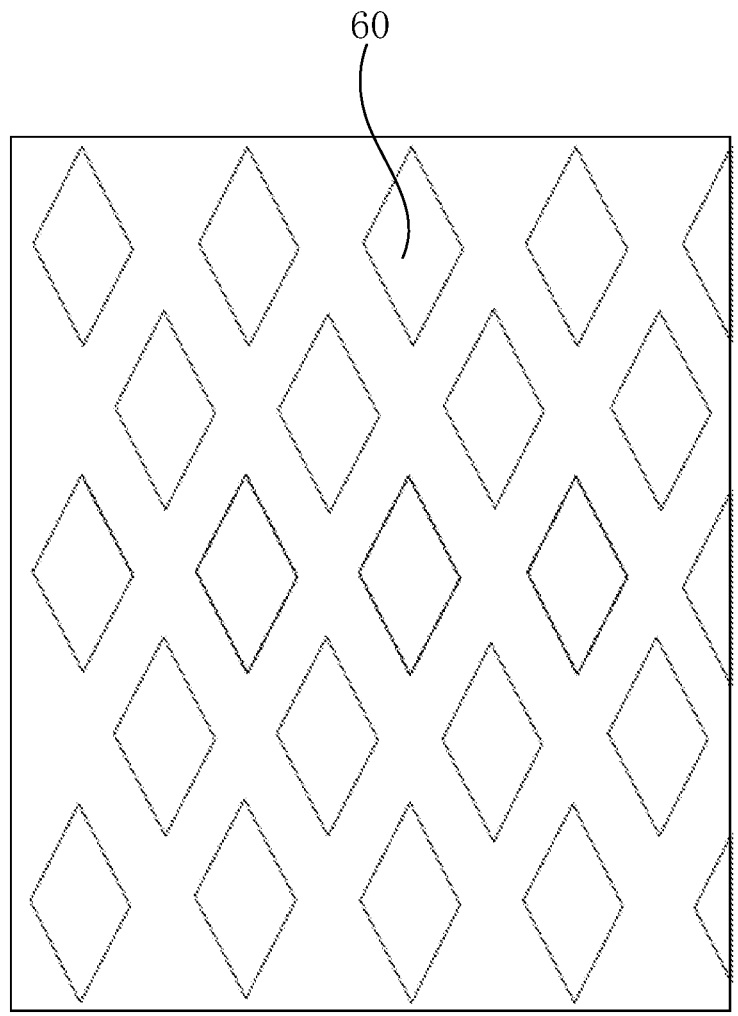
FIG. 11 is a top view of FIG. 10.
Figure 12:
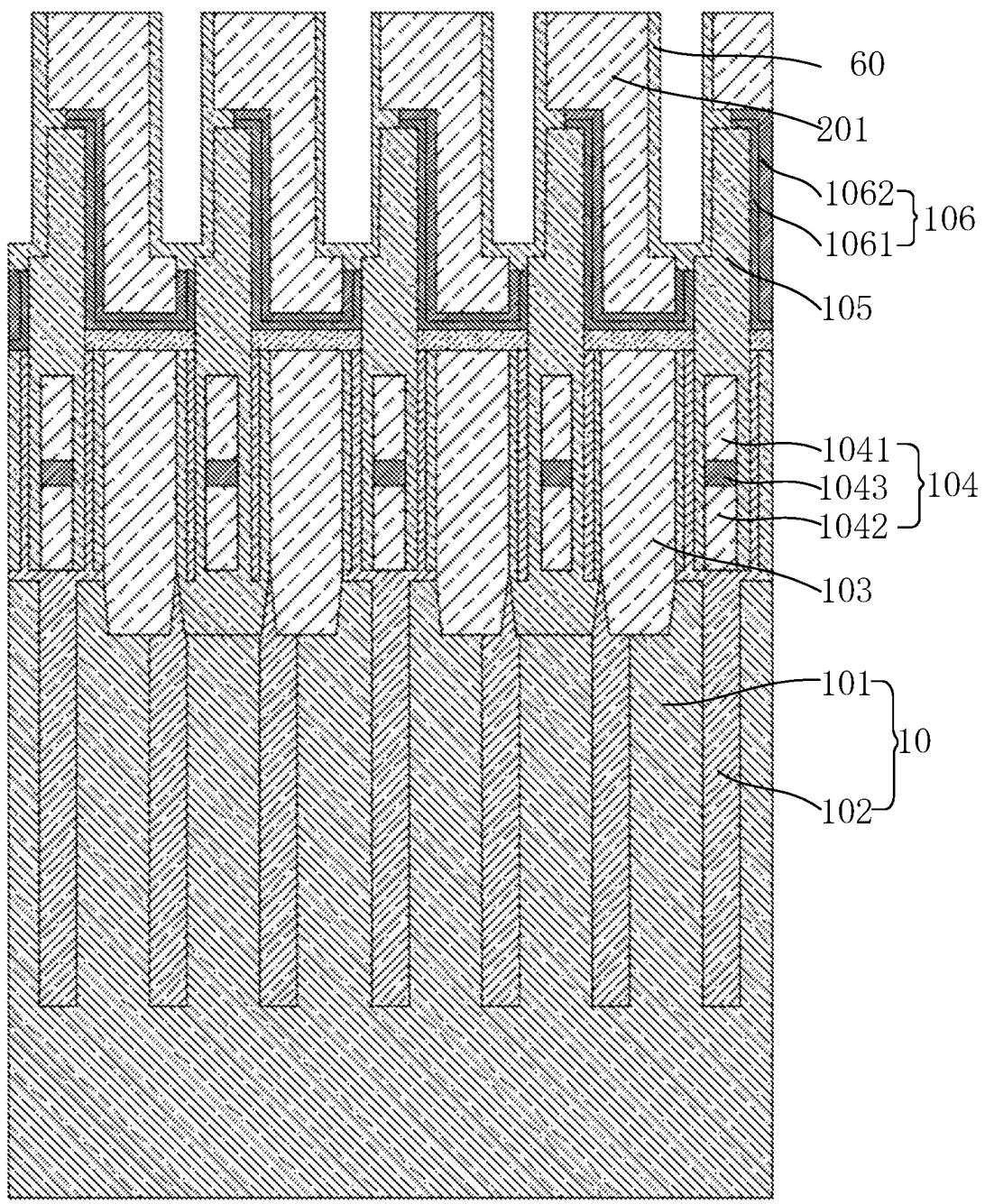
FIG. 12 is a schematic diagram of a structure after the residual core is removed by dry etching in a method of manufacturing semiconductor structure according to an embodiment of the present application.
Figure 13:
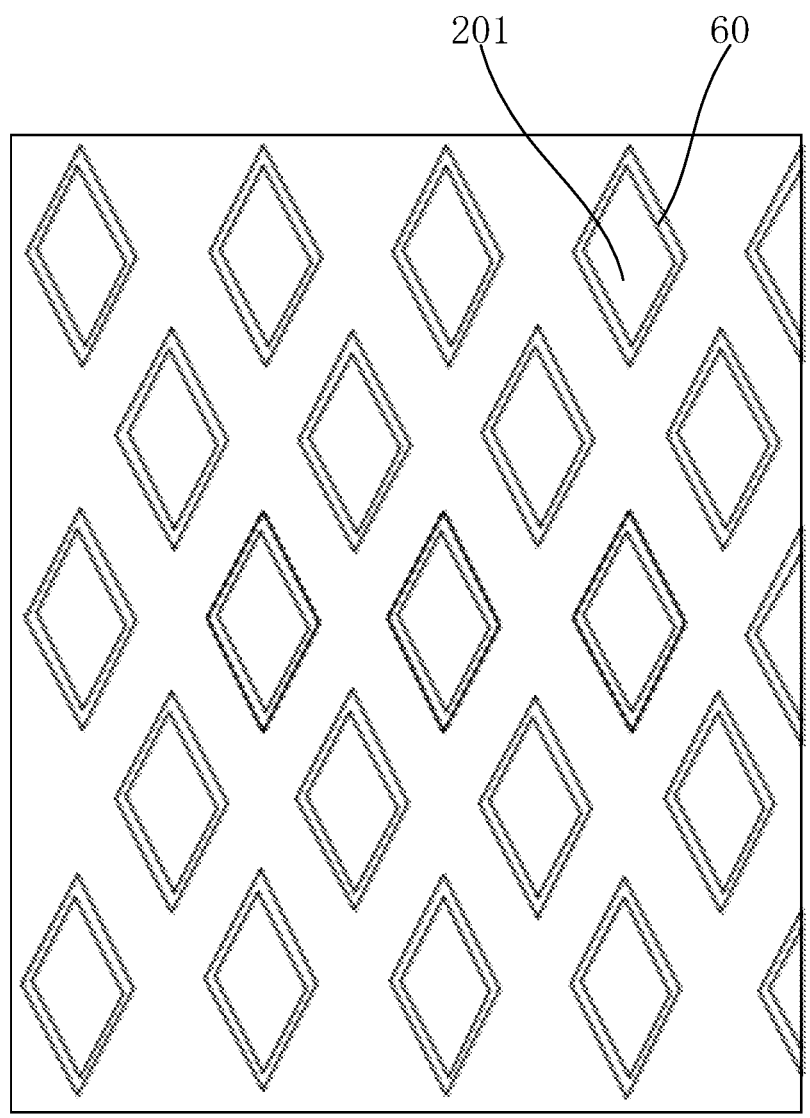
FIG. 13 is a top view of FIG. 12

In some embodiments, when the insulation structure 105 and the conductive layer 20 are etched by taking the first pattern 301 as a mask, a carbon-based polymer is formed on the sidewall. The conductive layer as tungsten is used as an example, as shown in FIG. 4 to FIG. 6, at high temperature, after etching, the halogen-containing by-products reacts with tungsten to form tungsten halides, halogen-containing by-products are easier to volatilize, and soon the halogen content in the tungsten halide becomes less, and the tungsten is difficult to volatilize, forming a shell-like inclusion of tungsten, which is the residual core.

Continuing to refer to FIG. 1, in this embodiment, after the contact structure is formed, the method of manufacturing semiconductor structure provided in this embodiment further includes:

S103: residual core on top ends of the contact pads away from the substrate is removed by dry etching.

In some embodiments, in the dry etching process, the gas used may include carbon tetrafluoride ($CF_4$) or trifluoromethane ($CHF_3$). Referring to FIGS. 10 to 13, dry etching has anisotropy, when the contact pads 201 are etched in the direction towards the substrate 10, it will not damage the sidewalls of the contact pads 201 and other film layers on the plane where the sidewalls of the contact pads 201 are located. In other words, the conductive barrier layer 106 between the second part of the contact pads 201 and the surface of the insulation structure 105 away from the substrate 10 will not be damaged, ensuring the connection force between the contact pads 201 and the insulation structure 105, thereby preventing the contact pads 201 from breaking.

In some embodiments, residual polymer 202 remains on the surfaces of the sidewalls and the top ends of the contact pad 201, and residual core 203 remains on the top ends of the contact pads 201, wherein the residual core 203 is located on the inner side of the top end surfaces. The residual core 203 is removed by dry etching can further reduce the connection resistance between the contact pads 201 and the capacitor structure, thereby improving the performance of the semiconductor structure.

In the implementation of taking the first patterns 301 of the pattern transfer layer 30 as a mask to remove part of the conductive layer 20 to form the contact pads 201, residual polymer is formed on the surfaces of the sidewalls and top ends of the contact pad 201, residual core is formed on the top surface of the contact pad 201. After the contact pads 201 are formed, the contact pads 201 are first wet-etched to remove residual polymer, and then the contact pads 201 are dry-etched to remove the residual core at the top ends of the contact pads 201.

The embodiment provides a method of manufacturing semiconductor structure and a semiconductor structure, a conductive layer 20 is formed on a substrate 10, and part of the conductive layer 20 is removed to form a contact structure composed of a plurality of contact pads 201. Each contact pad 201 is electrically connected to a transistor structure on a substrate 10; after the contact pads 201 are formed, the residual core 203 on the top ends of the contact pads 201 away from the substrate 10 is removed by dry etching; compared with wet etching, dry etching is anisotropic. When the contact pads 201 are etched in the direction of the substrate 10, it will not damage the sidewalls of the contact pads 201 and other film layers on the plane where the sidewalls of the contact pads 201 are located. In other words, the conductive barrier layer 106 between the contact pads 201 and the surface of the insulation structure 105 away from the substrate 10 will not be damaged, which ensures the connecting force between the contact pads 201 and the insulation structure 105, thereby avoiding the contact pads 201 breaking.

Continuing to refer to FIGS. 10 to 13, in the foregoing implementation manner, before the residual core 203 on the top ends of the contact pads 201 away from the substrate 10 is removed by dry etching, the method further includes: a protective layer 60 is formed on the a surface of each of the contact pads 201. With this arrangement, the protective layer 60 can protect the sidewalls and the a bottom of each of the contact pads 201, further prevent the conductive barrier layer 106 between the contact pads 201 and the insulation structure 105 from being damaged, and further prevent the contact pads 201 from breaking. In some embodiments, the material of the protective layer 60 may include insulating materials such as silicon nitride. The protective layer 60 may be formed by a process such as atomic deposition (ALD), and the thickness of the protective layer 60 may be 3 nm-7 nm, for example, the thickness of the protective layer 60 may be 5 nm.

The residual core 203 on the top ends of the contact pads 201 away from the substrate 10 is removed by dry etching includes: the protective layer 60 on the top ends of the contact pads 201 and the residual core 203 on the top ends of the contact pads are removed, by dry etching. In some embodiments, part of the contact pads 201 at the top ends can be removed to remove the residual core 203 in the contact pads 201 at the top ends.

Figure 14:
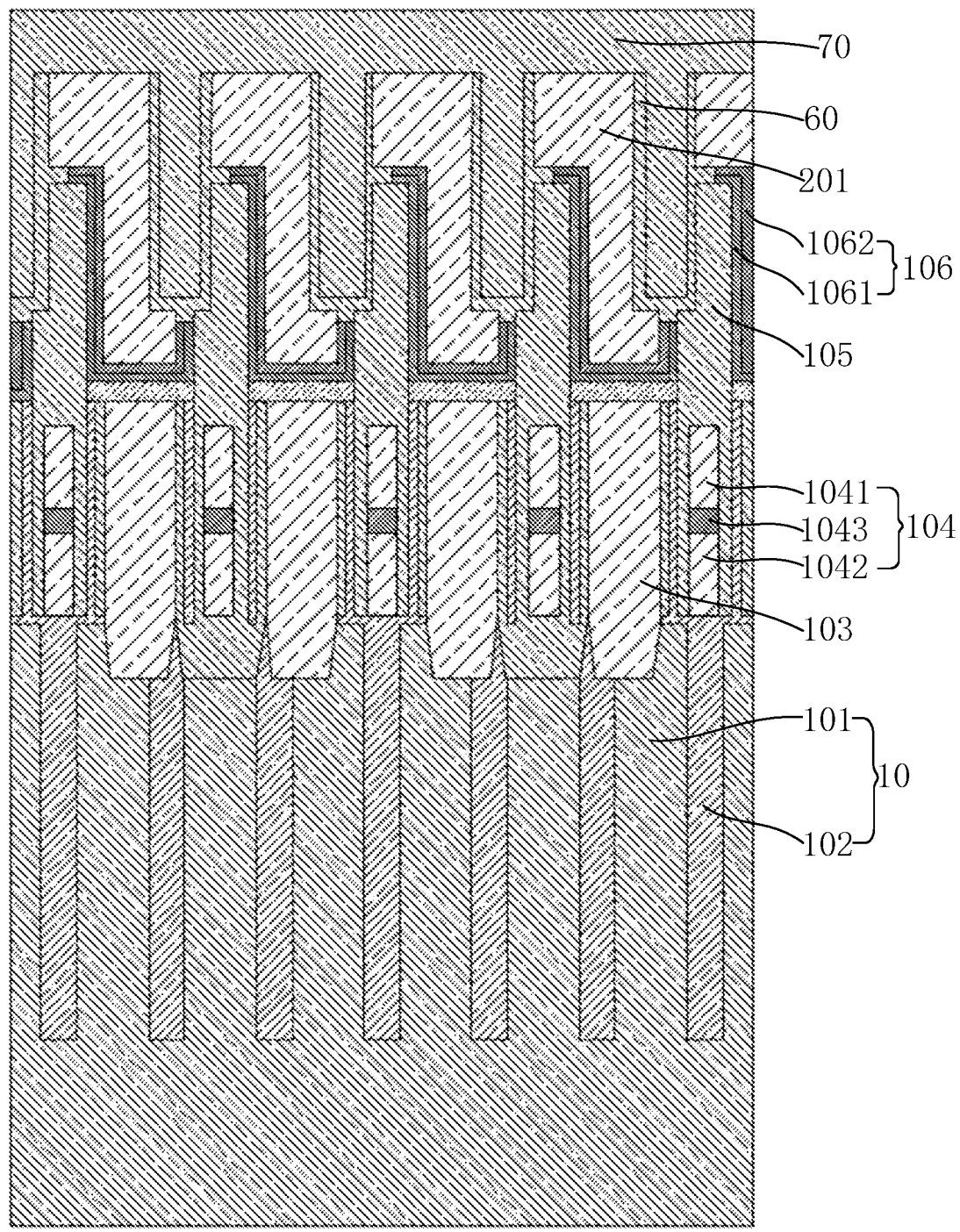
FIG. 14 is a schematic diagram of a structure after forming a filling layer in a method of manufacturing semiconductor structure according to an embodiment of the present application.
Figure 15:
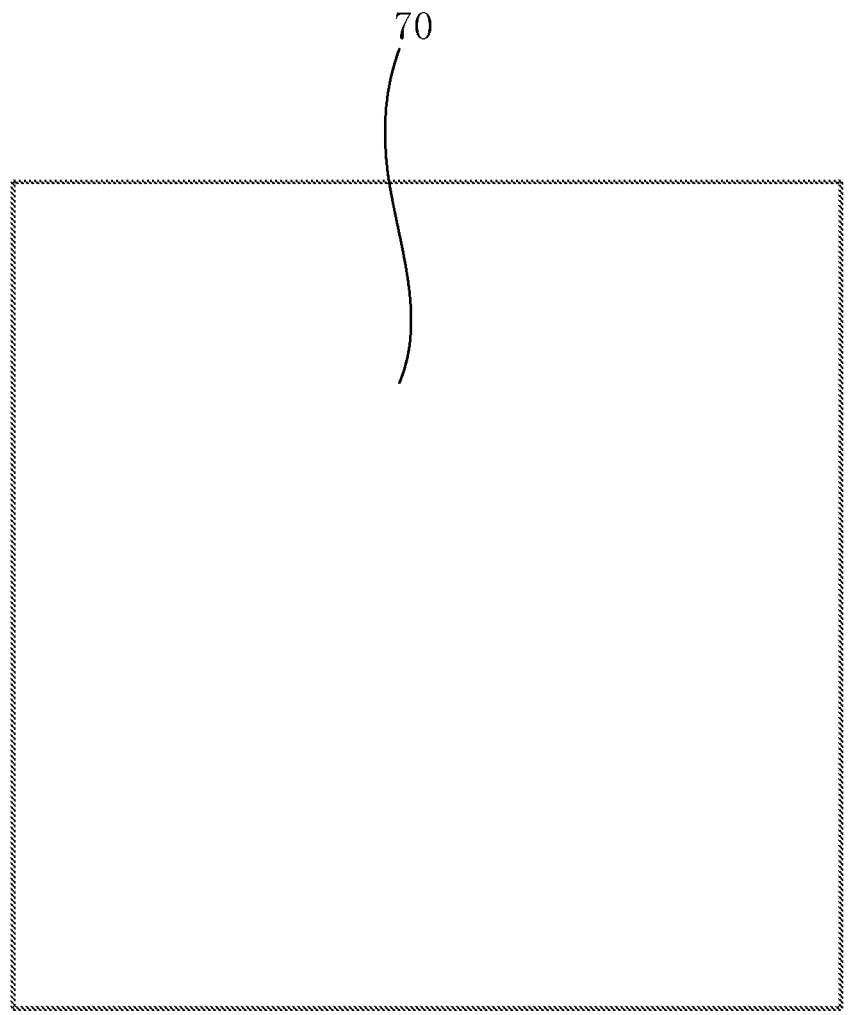
FIG. 15 is a top view of FIG. 14.

Referring to FIGS. 14 and 15, after the residual core 203 on the top ends of the contact pads 201 away from the substrate 10 is removed by dry etching, the method further includes: a filling layer 70 is formed, the filling layer 70 fills the gap between adjacent contact pads 201, and the filling layer 70 covers the top ends of the contact pads 201.

In this way, the filling layer 70 fills the gap between the adjacent contact pads 201 to support the contact pads 201 and prevent the contact pads 201 from tilting. In some embodiments, the material of the filling layer 70 may include insulating materials such as silicon nitride. In some implementations, the material of the filling layer 70 and the material of the protective layer 60 may be the same, so that after the filling layer 70 is formed, the filling layer 70 and the protective layer 60 may form an integrated structure, thereby improving the supporting effect of the contact pads 201.

Figure 16:
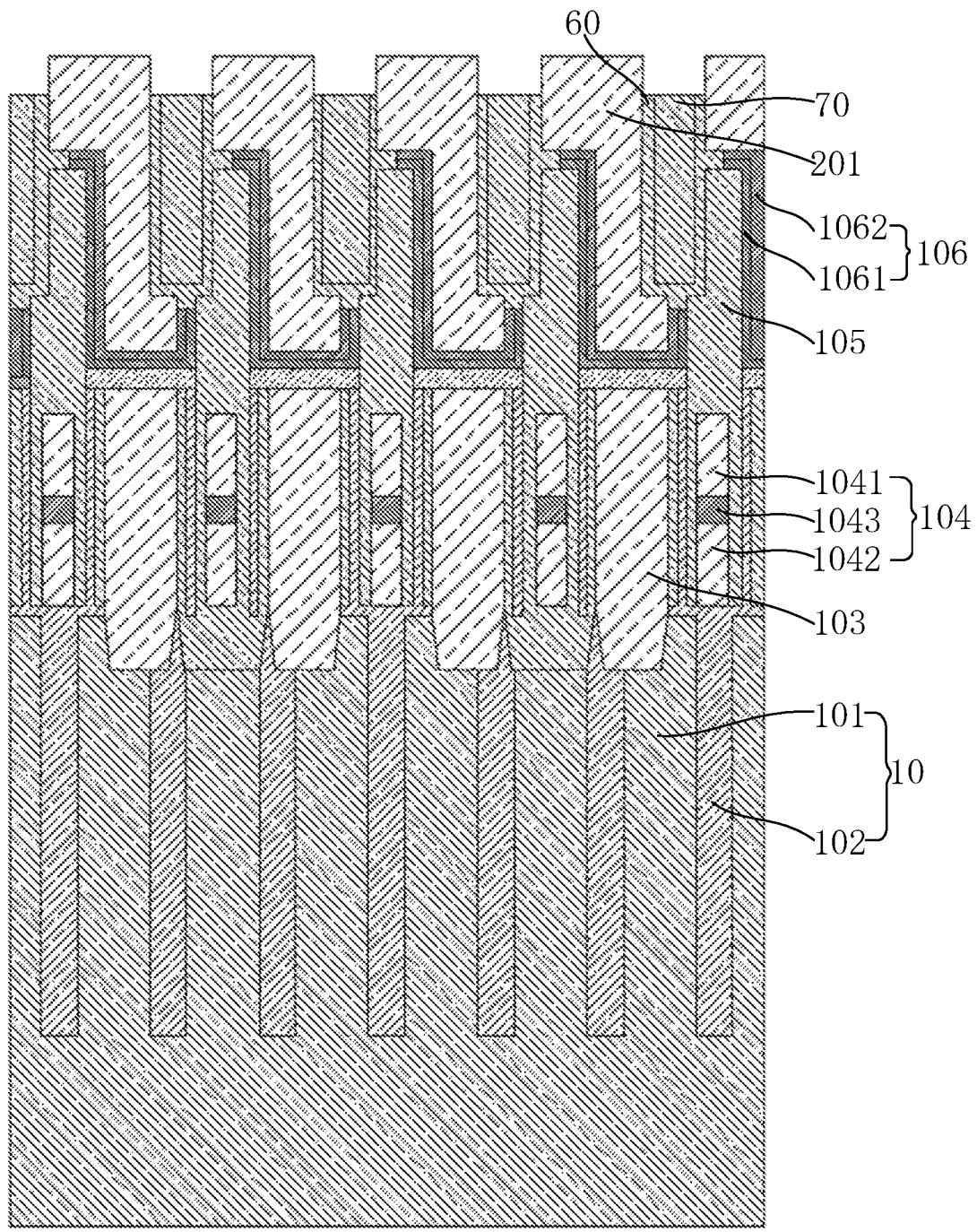
FIG. 16 is a schematic diagram of a structure after removing part of the filling layer to expose the top of the contact pad in a method of manufacturing semiconductor structure according to an embodiment of the present application.
Figure 17:
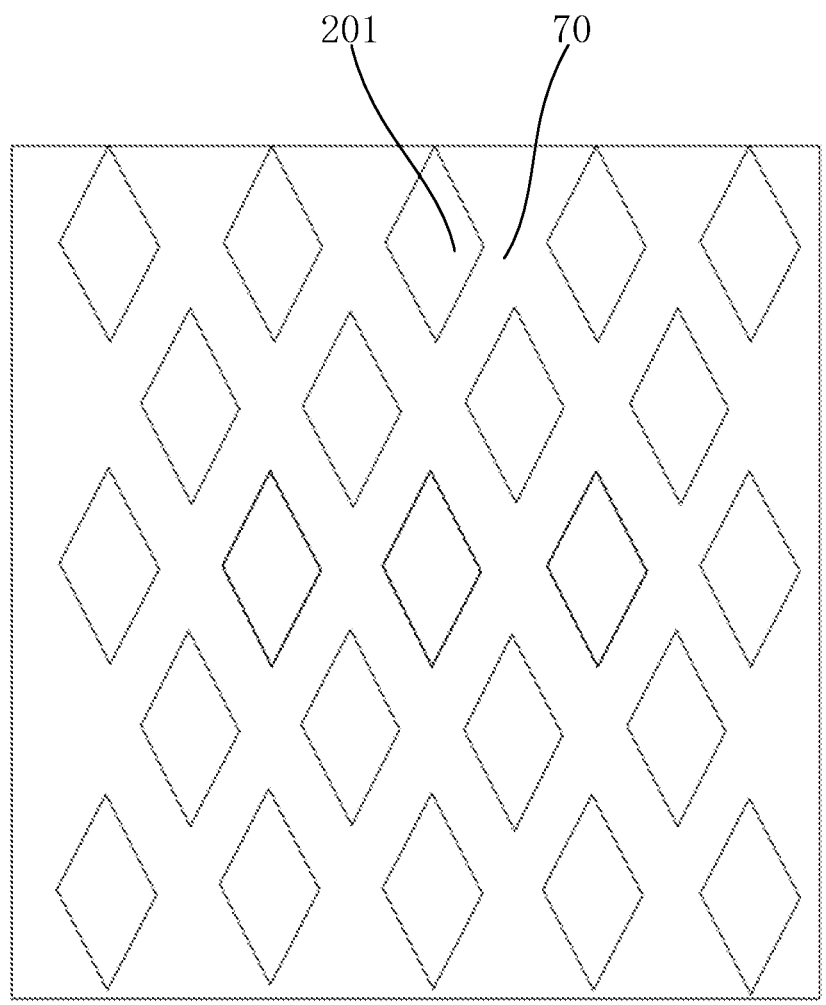
FIG. 17 is a top view of FIG. 16.

Referring to FIG. 16 and FIG. 17, in this embodiment, after the filling layer 70 is formed, the method further includes: a part of the filling layer 70 is removed to expose the top ends of the contact pads 201. This arrangement can facilitate the connection between the contact pads 201 and the capacitor structure in the subsequent process.

Continuing to refer to FIGS. 1 to 17, this embodiment also provides a semiconductor structure, including a substrate 10 and a contact structure arranged on the substrate 10. The substrate 10 has a plurality of transistor structures arranged at intervals, the contact structure includes a plurality of contact pads 201, and each contact pad 201 is connected to a transistor structure; After the contact pad 201 are formed, the residual core 203 on the top ends of the contact pads 201 away from the substrate 10 is removed by dry etching.

The semiconductor structure in this embodiment can be manufactured by the method of manufacturing semiconductor structure provided in any of the foregoing embodiments.

The embodiment provides a method of manufacturing semiconductor structure and a semiconductor structure, a conductive layer 20 is formed on a substrate 10, and part of the conductive layer 20 is removed to form a contact structure composed of a plurality of contact pads 201. Each contact pad 201 is electrically connected to a transistor structure on a substrate 10; after the contact pads 201 are formed, the residual core 203 on the top ends of the contact pads 201 away from the substrate 10 is removed by dry etching; compared with wet etching, dry etching is anisotropic. When the contact pads 201 are etched in the direction of the substrate 10, it will not damage the sidewalls of the contact pads 201 and other film layers on the plane where the sidewalls of the contact pads 201 are located. In other words, the conductive barrier layer 106 between the contact pads 201 and the surface of the insulation structure 105 away from the substrate 10 will not be damaged, which ensures the connecting force between the contact pads 201 and the insulation structure 105, thereby avoiding the contact pads 201 breaking.

Finally, it should be noted that the above embodiments are only used to illustrate the technical solutions of the present application, but not to limit them; although the present application has been described in detail with reference to the foregoing embodiments, those of ordinary skill in the art should understand that: It can still modify the technical solutions described in the foregoing embodiments, or equivalently replace some or all of the technical features. However, these modifications or replacements do not cause the essence of the corresponding technical solutions to deviate from the scope of the technical solutions of the embodiments of the present application.

The invention claimed is:

1. A method of manufacturing semiconductor structure, comprising:
   providing a substrate, the substrate being provided with a plurality of transistor structures arranged at intervals;
   forming a conductive layer on the substrate, and removing part of the conductive layer to form a contact structure composed of a plurality of contact pads; wherein each of the contact pads is electrically connected to a transistor structure;
   removing residual polymer on the contact pads by wet etching;
   forming an insulating protective layer on a surface of each of the contact pads; and
   removing, by dry etching, the protective layer on top ends of the contact pads, and residual core on the top ends of the contact pads away from the substrate, wherein at least part of the protective layer on sidewalls of the contact pads is retained.

2. The method of manufacturing semiconductor structure according to claim 1, wherein, after removing the residual core on the top ends of the contact pads away from the substrate by dry etching, the method of manufacturing semiconductor structure further comprises:
   forming a filling layer, the filling layer filling a gap between the adjacent contact pads, and the filling layer covering the top ends of the contact pads.

3. The method of manufacturing semiconductor structure according to claim 2, wherein, after forming the filling layer, the method of manufacturing semiconductor structure further comprises:
   removing part of the filling layer to expose the top ends of the contact pads.

4. The method of manufacturing semiconductor structure according to claim 1, wherein, before forming the conductive layer, the method of manufacturing semiconductor structure further comprises: forming an insulation structure on the substrate; wherein the insulation structure is provided with a plurality of contact holes, and each of the contact holes faces a transistor structure;
   forming the conductive layer comprises: forming the conductive layer in the contact holes and on the insulation structure.

5. The method of manufacturing semiconductor structure according to claim 4, wherein, removing part of the conductive layer to form the contact structure composed of a plurality of contact pads comprises:
   forming a pattern transfer layer on the conductive layer; wherein the pattern transfer layer is provided with a plurality of discrete first patterns, projections of the first patterns on the insulation structure cover a part of the contact holes; and
   etching part of the insulation structure and part of the conductive layer by taking the first pattern as a mask, to form a plurality of the contact pads.

6. The method of manufacturing semiconductor structure according to claim 5, wherein, forming the pattern transfer layer on the conductive layer comprises:
   sequentially forming the pattern transfer layer and a mask layer, on the conductive layer;
   patterning the mask layer to form a plurality of discrete second patterns; and
   etching the pattern transfer layer by taking the second pattern as a mask, to form a plurality of discrete first patterns.

7. The method of manufacturing semiconductor structure according to claim 4, wherein, after forming the insulation structure on the substrate, the method of manufacturing semiconductor structure further comprises:
   forming a conductive barrier layer on the insulation structure, sidewalls of each of the contact holes, and a bottom of each of the contact holes.

* * * * *